United States Patent
Yao et al.

(10) Patent No.: US 9,349,909 B2
(45) Date of Patent: May 24, 2016

(54) SEMICONDUCTOR LIGHT-EMITTING DEVICE WITH A PROTECTION LAYER AND THE MANUFACTURING METHOD THEREOF

(71) Applicant: Epistar Corporation, Hsinchu (TW)

(72) Inventors: Chiu-Lin Yao, Hsinchu (TW);
Chih-Chiang Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 157 days.

(21) Appl. No.: 14/293,825

(22) Filed: Jun. 2, 2014

(65) Prior Publication Data

US 2014/0273320 A1    Sep. 18, 2014

Related U.S. Application Data

(62) Division of application No. 12/982,210, filed on Dec. 30, 2010, now Pat. No. 8,779,447.

(30) Foreign Application Priority Data

Dec. 30, 2009    (TW) .............................. 098146164 A

(51) Int. Cl.
| | |
|---|---|
| *H01L 33/00* | (2010.01) |
| *H01L 33/10* | (2010.01) |
| *H01L 33/44* | (2010.01) |
| *H01L 33/64* | (2010.01) |
| *H01L 25/075* | (2006.01) |
| *H01L 33/62* | (2010.01) |

(52) U.S. Cl.
CPC .............. *H01L 33/007* (2013.01); *H01L 33/10* (2013.01); *H01L 33/44* (2013.01); *H01L 33/64* (2013.01); *H01L 25/0753* (2013.01); *H01L 33/0079* (2013.01); *H01L 33/62* (2013.01); *H01L 2924/0002* (2013.01)

(58) Field of Classification Search
CPC .......... H01L 33/54; H01L 33/58; H01L 33/62
USPC ........................................................ 438/27
See application file for complete search history.

(56) References Cited

U.S. PATENT DOCUMENTS

| | | | |
|---|---|---|---|
| 8,299,501 B2 | 10/2012 | Watanabe et al. | |
| 8,304,756 B2 | 11/2012 | Khan | |
| 8,324,632 B2 * | 12/2012 | Nagai | ........................ F21K 9/00 257/79 |
| 2008/0296627 A1 | 12/2008 | Watanabe et al. | |

FOREIGN PATENT DOCUMENTS

| | | |
|---|---|---|
| TW | 200514283 | 4/2005 |
| TW | 200514283 A | 4/2005 |

(Continued)

*Primary Examiner* — Monica D Harrison
(74) *Attorney, Agent, or Firm* — Muncy, Geissler, Olds & Lowe, P.C.

(57) ABSTRACT

The present application discloses a method for making a light-emitting device comprising steps of: providing a light-emitting unit comprising an epitaxial structure; providing a protection layer; connecting the light-emitting unit with the protection layer by a second connecting layer; providing a heat dispersion substrate; and connecting the heat dispersion substrate with the protection layer by a first connecting layer.

15 Claims, 10 Drawing Sheets

(56) References Cited

FOREIGN PATENT DOCUMENTS

| TW | 200603429 | 1/2006 |
| TW | 200603429 A | 1/2006 |
| TW | 200717846 | 5/2007 |
| TW | 200717846 A | 5/2007 |
| WO | WO 2008/054994 A1 | 5/2008 |
| WO | WO 2008/054994 A2 | 5/2008 |

* cited by examiner

US 9,349,909 B2

SEMICONDUCTOR LIGHT-EMITTING DEVICE WITH A PROTECTION LAYER AND THE MANUFACTURING METHOD THEREOF

CROSS REFERENCE TO RELATED APPLICATIONS

This application is a divisional application of U.S. patent application, Ser. No. 12/982,210, entitled "A SEMICONDUCTOR LIGHT-EMITTING DEVICE WITH A PROTECTION", filed on Dec 30, 2010, now pending, which claims the right of priority based on Taiwan Patent Application No. 098146164 entitled "A SEMICONDUCTOR LIGHT-EMITTING DEVICE WITH A PROTECTION LAYER", filed on Dec. 30, 2009, the entirety of which is incorporated herein by reference.

TECHNICAL FIELD

The present application generally relates to a semiconductor light-emitting device and the manufacturing method thereof, and more particularly to a semiconductor light-emitting device with a protection layer and the manufacturing method thereof.

BACKGROUND

An active layer of the light-emitting diode is between two different conductivity cladding layers. When a current is applied to the electrodes above the two cladding layers, the electrons and the holes from the two cladding layers can inject into the active layer, are combined to generate the omnidirectional light in the active layer that is emitted from every surfaces of the light emitting diode. Due to its different mechanism from the incandescent lamp, the light emitting diode is called the cold light source. A light emitting diode is applied widely in different fields such as automobiles, computers, communications, and consumption electronic products because it has low volume, long life-time, low driving voltage, low consumption electric quantity, rapid response speed, and good shock-proof advantages.

Nevertheless, the application of the conventional light emitting diode has a restriction for it can only be operated under the direct current with low voltage. The high voltage or alternating current might damage the light emitting diode easily, so it needs a converter system to be adopted in the city electricity system. Furthermore, during a conventional light emitting diode assembly process, there is usually an electric static discharge that increase the instantaneous reversion voltage, and then make the light emitting diode breakdown.

SUMMARY

The present application is to provide a light emitting device at least comprising a heat dispersion substrate, a first connecting layer on the heat dispersion substrate, a protection layer on the first connecting layer, a second connecting layer on the protection layer; and a light-emitting unit comprising an epitaxial structure on the second connecting layer. The protection layer can avoid the current leakage forming between the light-emitting unit and the heat dispersion substrate.

The present application is to provide an illumination unit at least comprising a heat dispersion substrate, a first connecting layer on the heat dispersion substrate, a protection layer on the first connecting layer, a second connecting layer on the protection layer, a micro chip illumination module on the second connecting layer, and a conductive structure wherein the conductive structure electrically connecting to each micro chip.

The present application is to provide a semiconductor light emitting device with a structure can avoid the reversion current breakdown at least comprising a heat dispersion substrate; a first connecting layer on the heat dispersion substrate; a protection layer on the first connecting layer; a second connecting layer on the protection layer; a light-emitting diode on the second connecting layer; and a conductive structure electrically connecting the protection layer and the light-emitting diode in anti-parallel connection.

The present application is to provide a method for making a light-emitting device comprising steps of: providing a light-emitting unit comprising an epitaxial structure; providing a protection layer; connecting the light-emitting unit with the protection layer by a second connecting layer; providing a heat dispersion substrate; and connecting the heat dispersion substrate with the protection layer by a first connecting layer.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
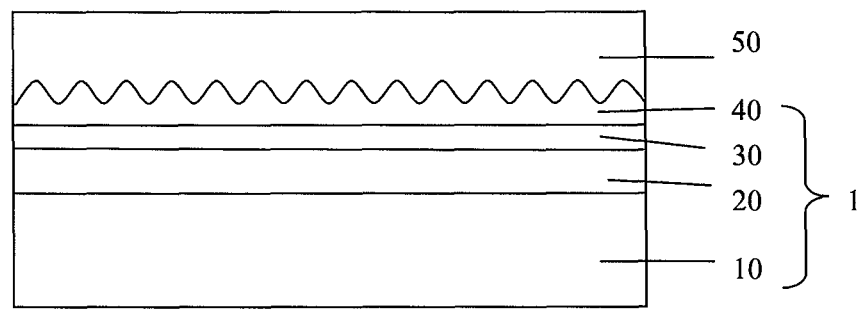
FIGS. 1, 2(a), 3-7 illustrate diagrams of a semiconductor device structure in accordance with the first embodiment of the present application.

The first embodiment of the present application discloses a semiconductor light emitting device with a protection layer structure which is highly insulative, wherein the protection layer can avoid the current leakage forming between the light-emitting unit and the heat dispersion substrate. The foregoing aspects and many of the attendant advantages of this application will become more readily appreciated as the same becomes better understood by reference to the following detailed description, when taken in conjunction with the FIG. 1-FIG. 7. The application discloses a semiconductor light emitting device 11 with a light emitting unit comprising an epitaxial structure 1. The epitaxial structure 1 comprises a first growth substrate 10, a first conductivity type semiconductor layer 20 formed on the first growth substrate 10, an active layer 30 formed on the first conductivity type semiconductor layer 20, and a second conductivity type semiconductor layer 40 formed on the active layer 30, as shown in FIG. 1. The method of forming an epitaxial structure comprises providing a first growth substrate 10, then growing a first conductivity type semiconductor layer 20 on the first growth substrate 10 by the Metal-Organic Chemical Vapor Deposition method. When the growth of the first conductivity type semiconductor layer 20 is finished, the active layer 30 and the second conductivity type semiconductor layer 40 are grown successively. The first growth substrate 10 mentioned above can be GaAs. The first conductivity type semiconductor layer 20, the active layer 30 and the second conductivity type semiconductor layer 40 mentioned above comprise III-V group compound, such as AlGaInP series material. A regularly or irregularly roughened surface is formed on the surface of the second conductivity type layer 40 by an etch method, and a second connecting layer 50 is formed on the roughened surface.

Figure 2A:
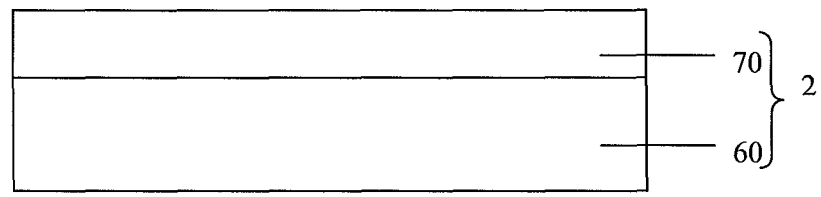
Figure 2:
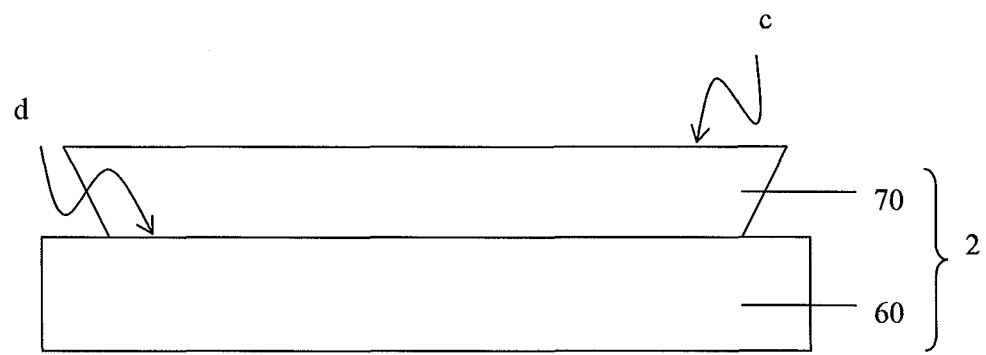
FIGS. 2(b)-2(e) illustrate diagrams of a semiconductor device structure in accordance with the second embodiment of the present application.
Figure 3:
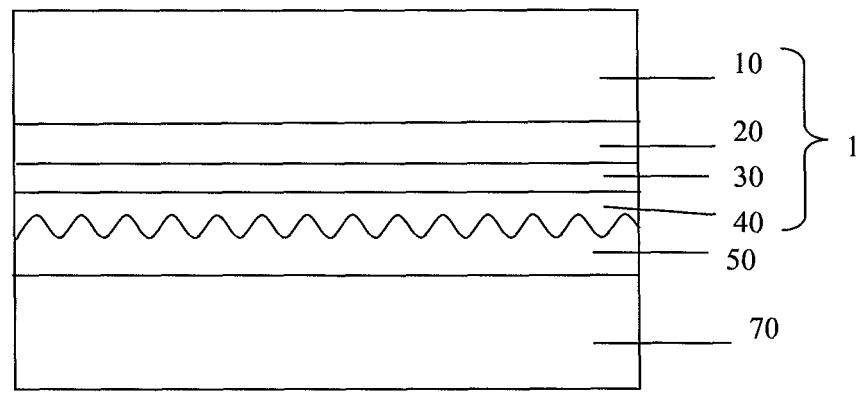

Referring to FIG. 2(a), another epitaxial structure 2 which has a protection layer 70 grown on a second growth substrate 60 by the Metal-Organic Chemical Vapor Deposition method. The second growth substrate can be sapphire, the protection layer 70 is highly insulative and includes III-V group compound such as AlInGaN series material wherein undoped GaN is a preferred material. A regularly or irregularly roughened surface is formed on the protection layer 70 surface by etch method (not shown in the figures). The epitaxial structure 1 is connected with the epitaxial structure 2 by the second connecting layer 50, and the second growth substrate 60 is removed then so the structure shown in FIG. 3 is formed.

Figure 4:
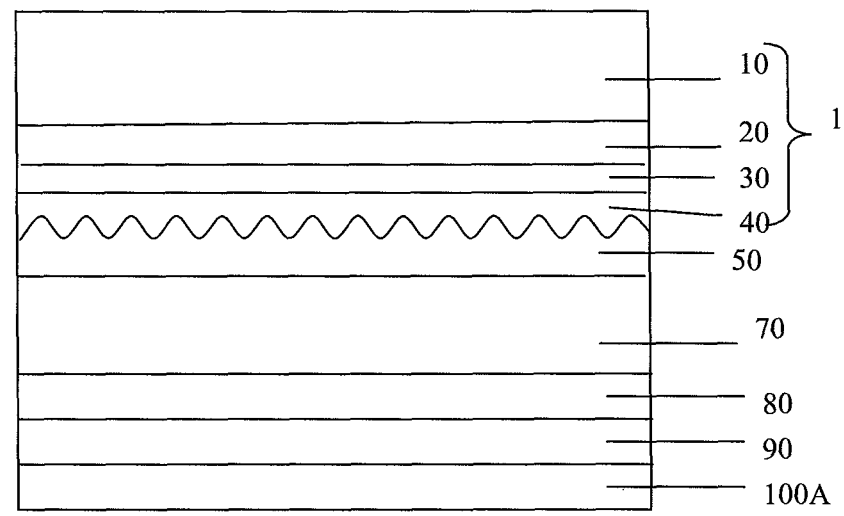
Figure 5:
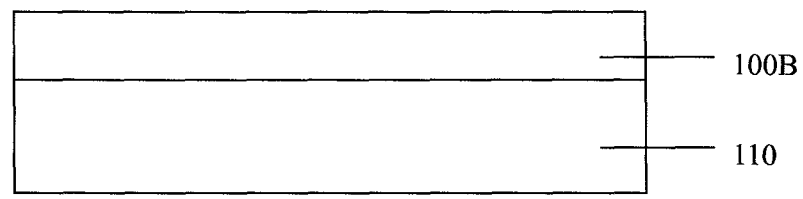
Figure 6:
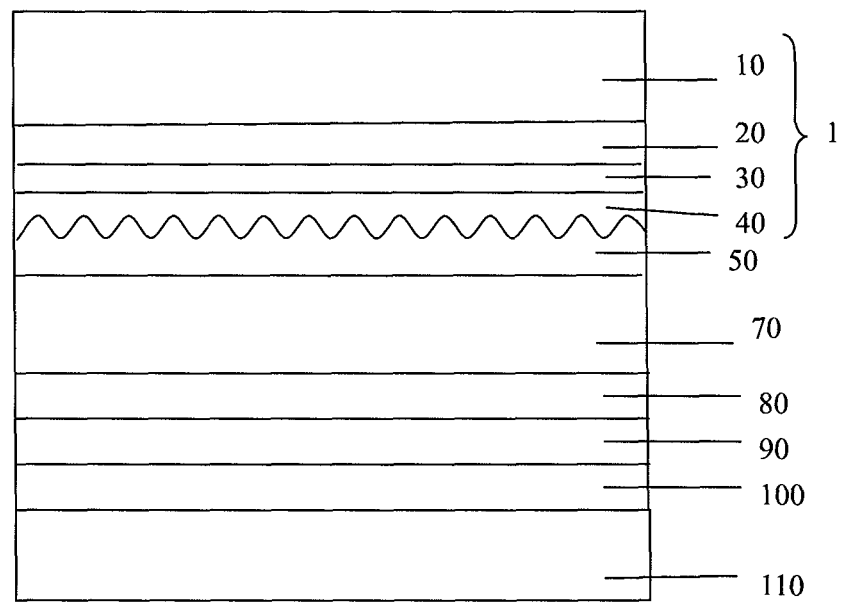

As FIG. 4 shows, an adhesive layer 80, a reflection layer 90 and a third connecting layer 100A are formed in sequence on the protection layer 70. As FIG. 5 shows, a heat dispersion substrate 110 is provided, and a forth connecting layer 100B is formed on the heat dispersion substrate 10. The structure having the third connecting layer 100A shown in FIG. 4 faces the structure having the forth connecting layer 100B shown in FIG. 5 so the third connecting layer 100A and the forth connecting layer 100B form a first connecting layer 100, as FIG. 6 shows. The material of the second connecting layer 50 can be polymer material like BCB, Epoxy, SOG, SU8 etc., or oxide such as $TiO_2$, $Ti_2O_5$, $Ta_2O_3$, $Ta_2O_5$, ITO, AZO, ZnO, and $Al_2O_3$, or nitride such as $SiON_X$, $SiN_X$, GaN, AlN, or diamond. The function of the adhesive layer 80 is to increase the adhesive force between the protection layer 70 and the reflection layer 90, the material of the adhesive layer can be ITO or ZnO, the material of the reflection layer 90 can be aluminum, silver, or other high reflectivity materials. The material of the first connecting layer 100, the third connecting layer 100A, and the forth connecting layer 100B can be soldering tin, low temperature metal, and metal silicides, such as PbSn, AuGe, AuBe, AuSi, Sn, In, PdIn. The material of the heat dispersion substrate 110 can be Si, Ge, Cu, Mo, AlN, ZnO.

Figure 7:
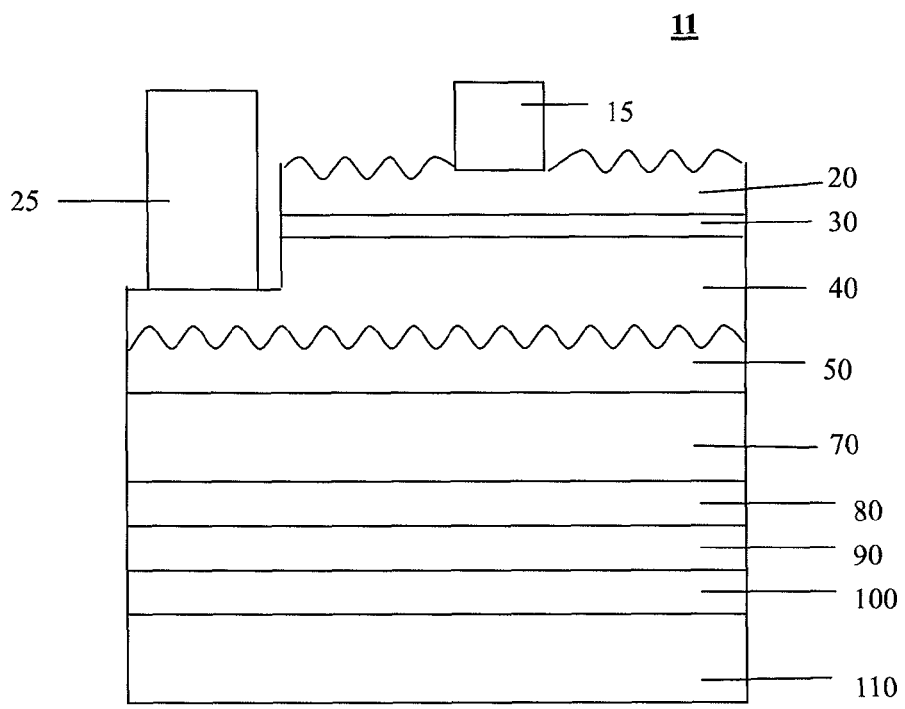

The upper surface of the first conductivity type semiconductor 20 is exposed after removing the first growth substrate 10, then the regularly or irregularly roughened surface is formed by the etch method. By etching from the first conductivity type semiconductor layer 20 to the second conductivity type semiconductor layer 40, a partial portion surface of the second conductivity type semiconductor layer is exposed, then the electrodes 15 and 25 are formed on the upper surface of the first conductivity type semiconductor layer 20 and on the exposed surface of the second conductivity type semiconductor layer 40, then the structure of the light-emitting device 11 as the FIG. 7 is formed.

Figure 2C:
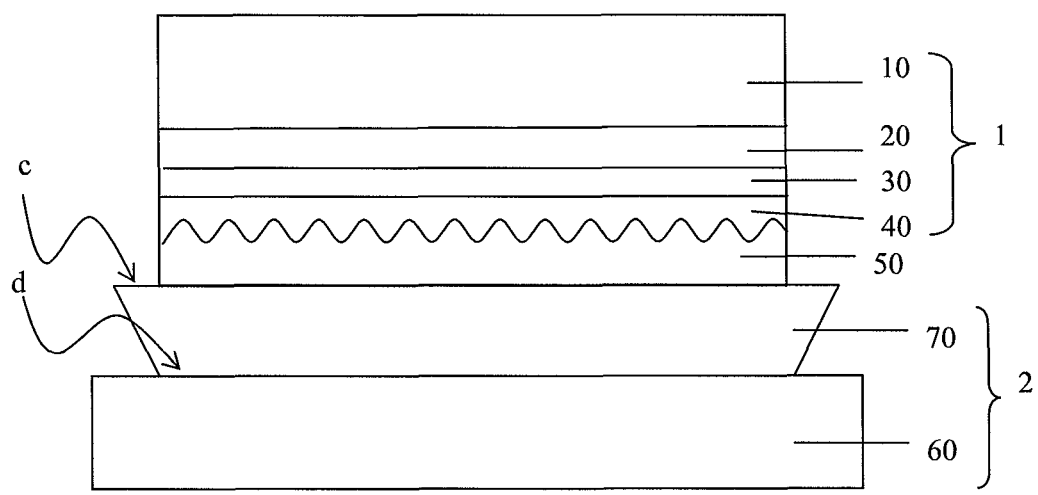
Figure 2D:
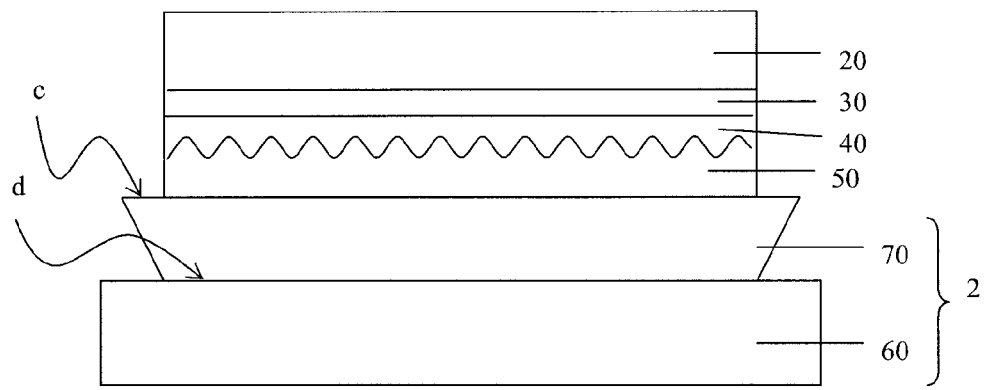

The second embodiment of the present application discloses a semiconductor light emitting device with a protection layer structure which is highly insulative. The foregoing aspects and many of the attendant advantages of this application will become more readily appreciated as the same becomes better understood by reference to the following detailed description when taken in conjunction with the FIG. 2(b)-FIG. 2(e). Referring to FIG. 2(b), another epitaxial structure 2 which has a protection layer 70 grown on a second growth substrate 60 by the Metal-Organic Chemical Vapor Deposition method is provided. The second growth substrate can be sapphire, and the protection layer 70 is highly insulative and includes III-V group compound such as AlInGaN series material wherein undoped GaN is a preferred material. A regularly or irregularly roughened surface is formed on the protection layer 70 surface by etch method (not shown in the figures). The protection layer has the first surface c and the second surface d, the area of the first surface c is larger than the area of the second surface d. The epitaxial structure 2 is larger than the epitaxial structure 1 in size. The epitaxial structure 1 is connected with the epitaxial structure 2 by the second connecting layer 50, so the structure shown in FIG. 2(c) is formed.

Figure 2E:
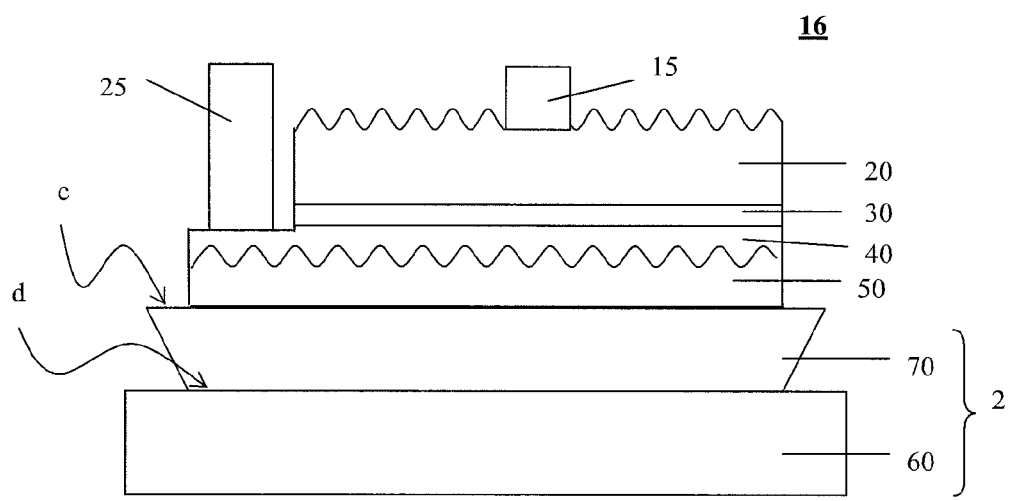

The upper surface of the first conductivity type semiconductor 20 is exposed after removing the first growth substrate 10, then the regularly or irregularly roughened surface is formed by the etch method. By etching from the first conductivity type semiconductor layer 20 to the second conductivity type semiconductor layer 40, a partial portion surface of the second conductivity type semiconductor layer is exposed, then the electrodes 15 and 25 are formed on the upper surface of the first conductivity type semiconductor layer 20 and on the exposed surface of the second conductivity type semiconductor layer 40, then the structure of the light-emitting device 16 as FIG. 2(e) is formed.

Figure 8:
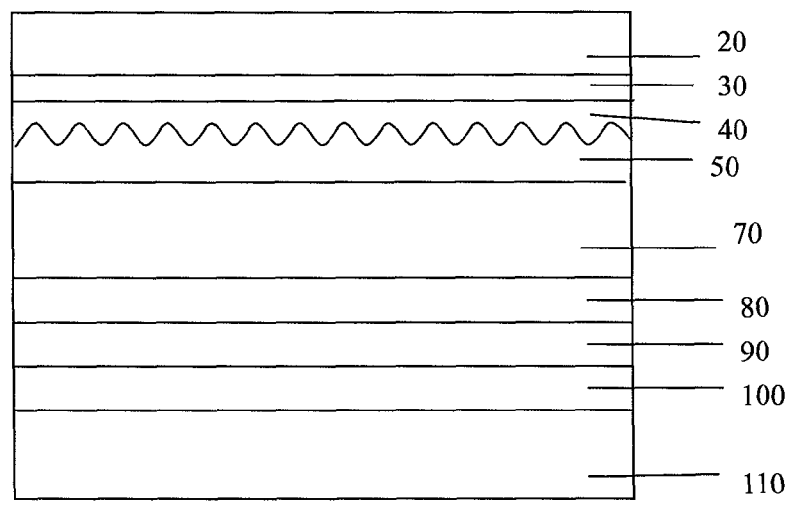
FIGS. 8-12 illustrate diagrams of a semiconductor device structure in accordance with the third embodiment of the present application.
Figure 9:
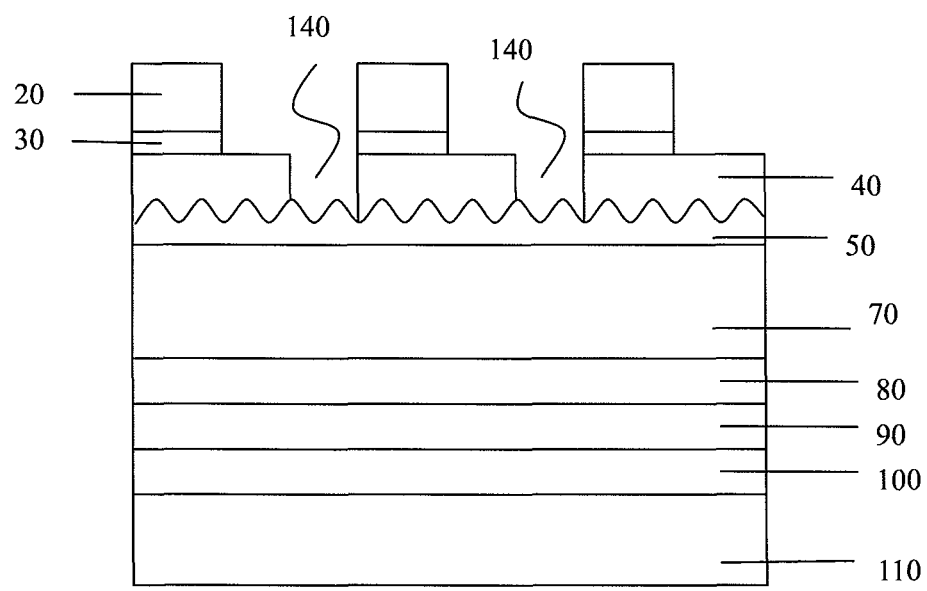

The third embodiment of the present application discloses a semiconductor light emitting device with a protection layer structure which is highly insulative, and it can avoid the high voltage to breakdown the semiconductor light emitting device structure. The foregoing aspects and many of the attendant advantages of this application will become more readily appreciated as the same becomes better understood by reference to the following detailed description, when taken in conjunction with the FIGS. 8-12. The semiconductor light emitting device of this embodiment is operated in direct current or alternating current, and the device structure and manufacturing process different from that of the first embodiment as shown in FIGS. 1-6 are described as follows. First, removing the first growth substrate 10 in FIG. 6, as shown in FIG. 8. As FIG. 9 shows, forming the plurality of openings 140 by etching the first conductivity type semiconductor layer 20, active layer 30, the second conductivity type semiconductor layer 40, and the upper surface of the second connecting layer 50 by developing and etch process. Then etching the first conductivity type semiconductor layer 20, active layer 30, and the upper surface of the second conductivity type semiconductor layer 40 by developing and etch process.

Figure 10:
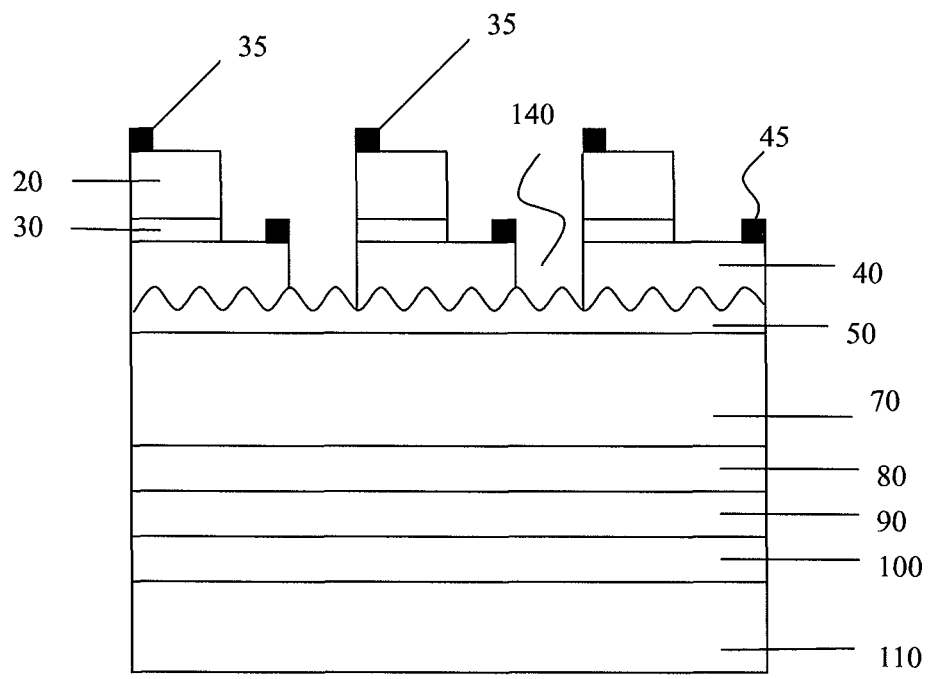

As FIG. 10 shows, the plurality of electrodes 35, 45 are formed on respectively and connecting electrically with the first conductivity type semiconductor layer 20 and the second conductivity type semiconductor layer 40 to form the plurality of micro chips 13. The electrodes 35, 45 are formed by deposition method for ohmic contact.

Figure 11:
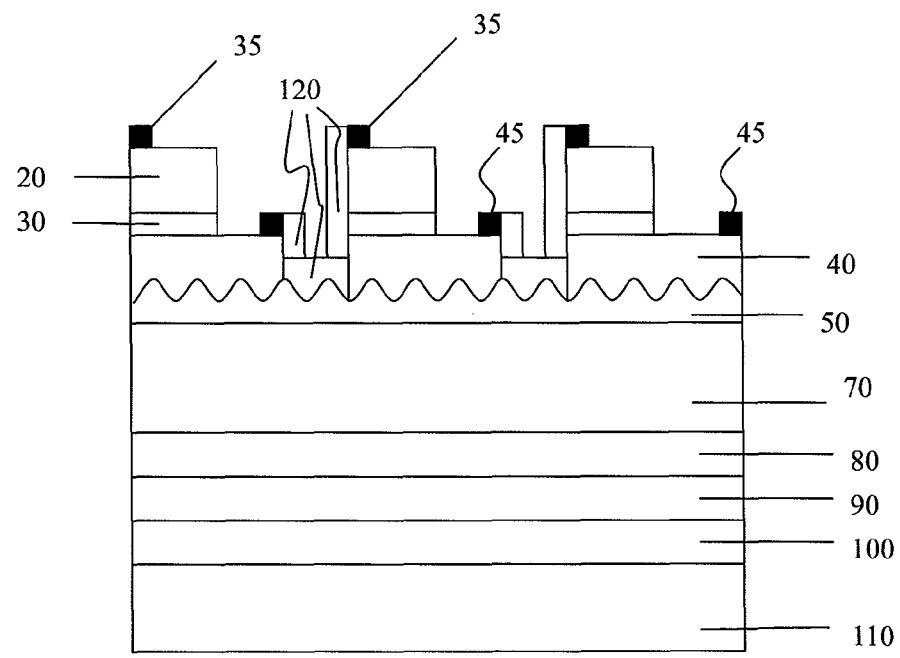
Figure 12:
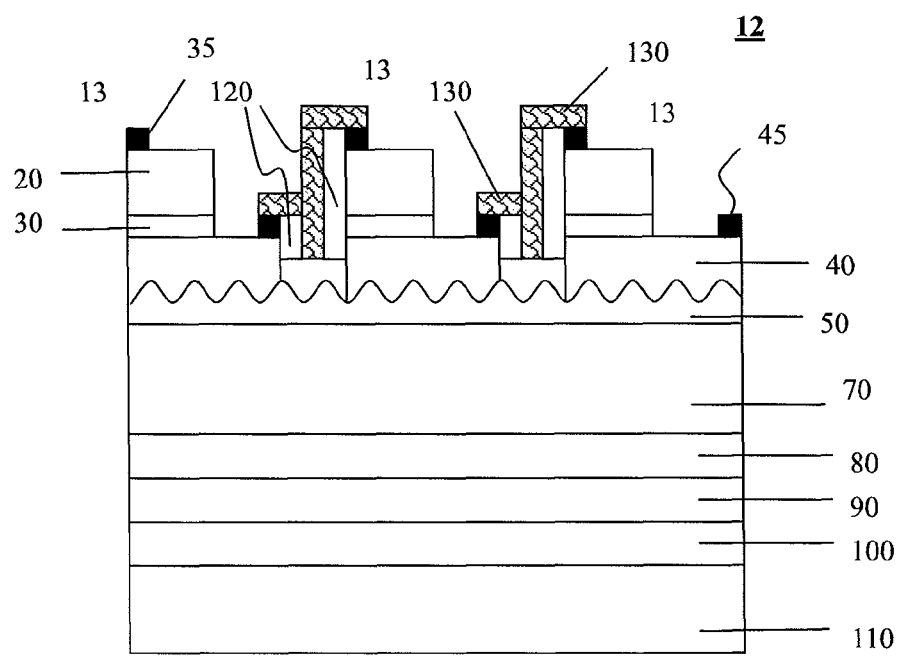

An insulating layer 120 is formed inside the plurality of openings 140 to avoid the current leakage. The material of the insulating layer can be dielectric materials such as SiOx or SiNx as shown in FIG. 11. Finally, the plurality of conductive structures 130 are formed and are connected electrically with the plurality of electrodes 35, 45 in a series connection or parallel connection. The illumination unit including the lighting module composed of the plurality of micro chips 13 is shown in FIG. 12. Every active layer of every micro chip emits the same or different wavelength, and the module composed with the plurality of micro chips can be operated in direct current or alternating current.

The fourth embodiment of the present application discloses a semiconductor light emitting device with a protection layer structure which is highly insulative, and it can avoid the reversion current to breakdown the semiconductor light emitting device structure. The foregoing aspects and many of the attendant advantages of this application will become more readily appreciated as the same becomes better understood by reference to the following detailed description, when taken in conjunction with the FIG. 13(a)-FIG. 13(d).

Figure 13A:
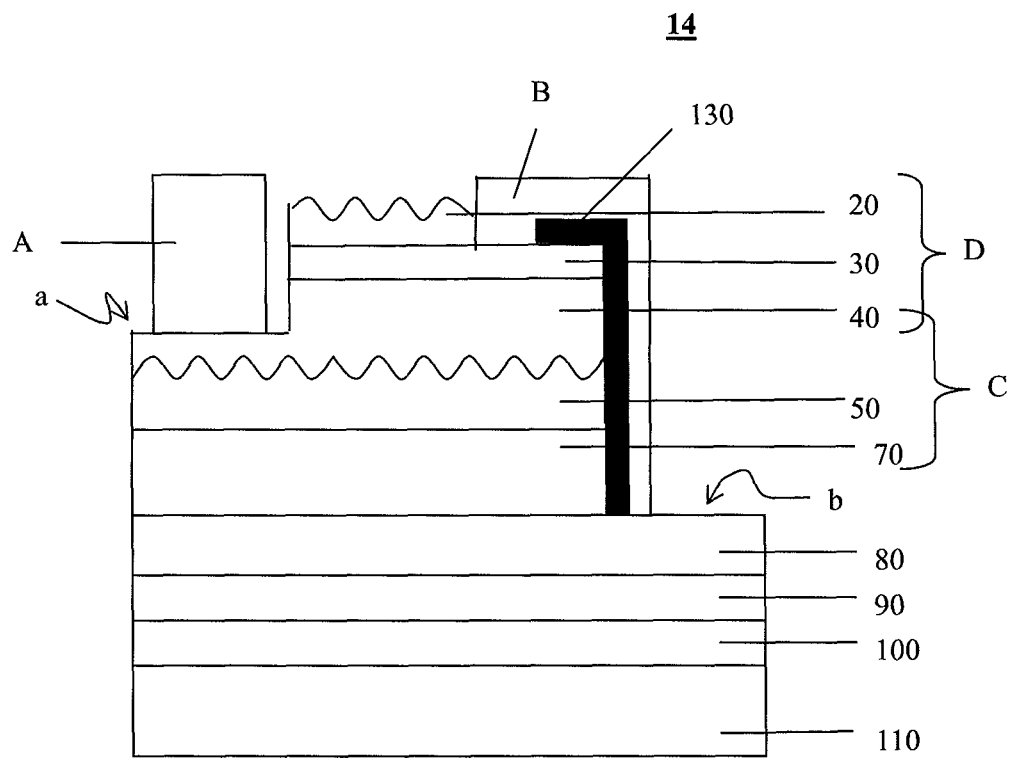
FIGS. 13(a)-13(d) illustrate diagrams of a semiconductor device structure in accordance with the fourth embodiment of the present application.
Figure 13B:
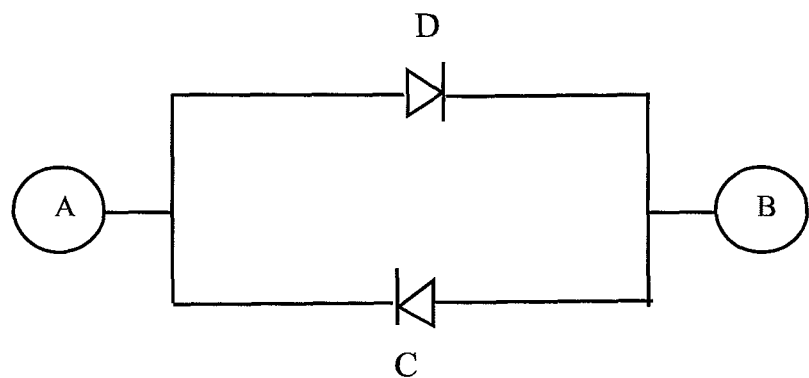
Figure 13C:
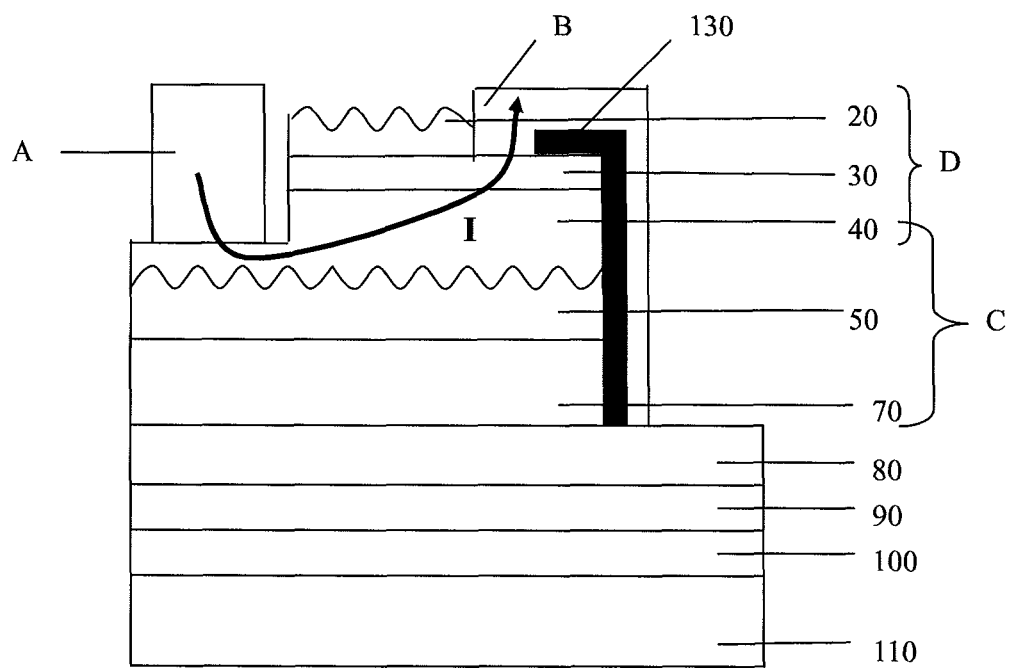
Figure 13D:
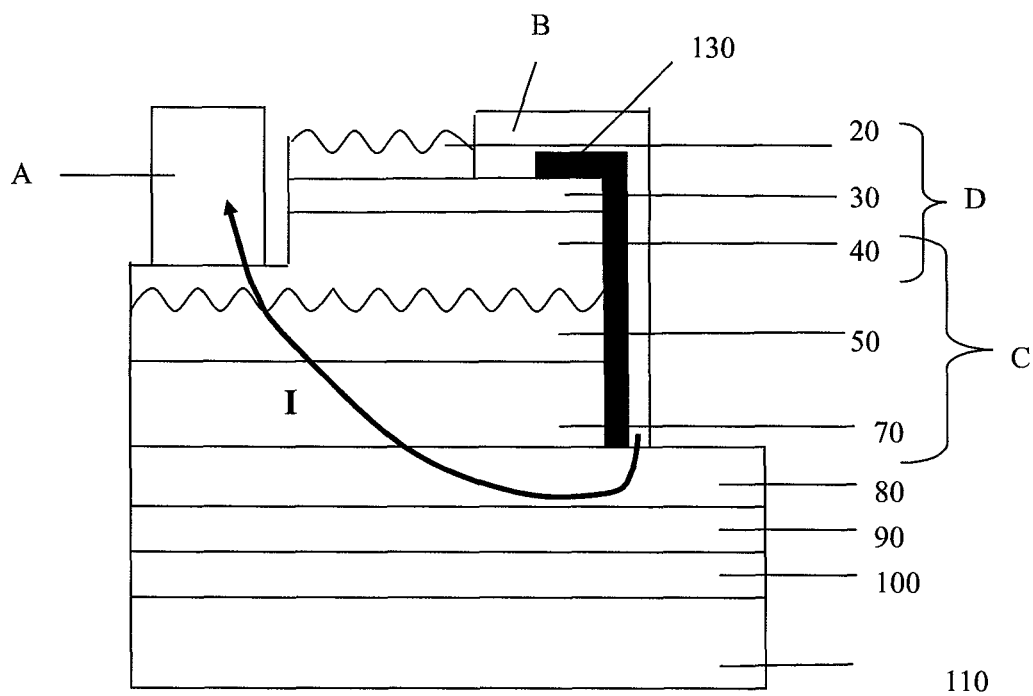

The light emitting diode 14 that can avoid the reverse current breaking down the structure is exemplified in this embodiment. There are three differences in device structure and manufacturing process compared with the first embodiment shown in FIGS. 1-6. First, the protection layer 70 is composed of conductive materials, and the electricity is different from the second conductivity type semiconductor layer 40, and the material can be GaN doped with the impurity, dope a single layer structure of III-V group materials or zinc oxide doped with the impurity, or a multiple layers structure stacked alternately with zinc oxide and silicon or zinc oxide and indium oxide tin. Second, the material of forming the second connecting layer 50 can be soldering tin, low temperature metal, and metal silicide, such as PbSn, AuGe, AuBe, AuSi, Sn, In, and PdIn. Third, the material of forming the first connecting layer 100 can be polymer material like BCB, Epoxy, SOG, SUB, or oxide such as $TiO_2$, $Ti_2O_5$, $Ta_2O_3$, $Ta_2O_5$, ITO, AZO, ZnO, and $Al_2O_3$, or nitride such as SiONx, SiNx GaN, AlN, or diamond. As FIG. 13(a) shows, removing the first growth substrate (not shown in the figures) to expose the top surface of the first conductivity type semiconductor layer 20, then forming a regularly or an irregularly roughened surface by etch method. By etching from up the first conductivity type semiconductor layer 20 to down the active layer 30, a portion surface a of the second conductivity type semiconductor layer 40 is exposed, then by etching from up the first conductivity type semiconductor layer 20 down to the active layer 30, the second conductivity type semiconductor layer 40, the second connecting layer 50, the protecting layer 70, and the top surface b of the adhesive layer 80 is exposed. Forming an electrode A on the exposed surface a of the second conductivity type semiconductor layer 40 electrically connecting with the second conductivity type semiconductor layer 40. Forming a conductive structure 130 on the sidewall of the active layer 30, the second conductivity type semiconductor layer 40, the second connecting layer 50, and the protecting layer 70, then forming an electrode B covering the conductive structure to form the light-emitting diode 14. The conductivity type of the protecting layer 70 is different from the second conductivity type semiconductor layer 40 and can form a diode characteristic stack C to prevent the electric static discharge. The diode stack structure D is formed by the first conductivity type semiconductor layer 20, the active layer 30, and the second conductivity type semiconductor layer 40, and electrically connected to the diode characteristic stack in anti-parallel by the conductive structure 30, as FIG. 13(b) shows. As FIG. 13(c) shows, when the forward current flows from electrode A to electrode B, the current passes through the diode stack structure D formed by the second conductivity type semiconductor layer 40, the active layer 30, and the first conductivity type semiconductor layer 20 in sequence, and the light-emitting diode 14 is normal operation. As FIG. 13(d) shows, when the reverse current flows from electrode B to electrode A, the current passes through the diode stack structure C formed by the adhesive layer 80, the protecting layer 70, the second connecting layer 50, and the second conductivity type semiconductor layer 40 in sequence to prevent the electric static discharge. The current does not flow through the active layer 30 so the device structure having no breakdown by the reverse current is formed.

The stack structure C formed by the protecting layer 70, the second connecting layer 50 and the second conductivity type semiconductor layer 40 is provided with a function to prevent the electric static discharge.

The embodiments of the above mentioned, the growth substrate is at least one material selected from the group consist of silicon carbide, gallium nitride, and aluminum nitride. The first conductivity type semiconductor layer, the active layer, ant the second conductivity type semiconductor layer of the above mentioned can be a single layer or multiple layers structure, such as super-lattice. Besides, the epitaxial structure of the application mentioned does not limit to growth in epitaxial method on the growth substrate, other forming methods such as directly connect or connect to a heat dispersion substrate by a medium in connecting method belong to the scope of the application.

It should be noted that the proposed various embodiments are not for the purpose to limit the scope of the invention. Any possible modifications without departing from the spirit of the invention may be made and should be covered by the application.

We claim:

1. A method for making a light-emitting device comprising steps of:
   providing a light-emitting unit comprising an epitaxial structure;
   providing a protection layer;
   connecting the light-emitting unit with the protection layer by a second connecting layer;
   providing a heat dispersion substrate; and
   connecting the heat dispersion substrate with the protection layer by a first connecting layer.

2. The method for making a light-emitting device according to claim 1, wherein the step of providing a light-emitting unit further comprises a step of providing a first growth substrate and a step of forming the epitaxial structure on the first growth substrate.

3. The method for making a light-emitting device according to claim 2, further comprising a step of removing the first growth substrate to expose the epitaxial structure after the step of connecting the light-emitting unit with the protection layer by the second connecting layer.

4. The method for making a light-emitting device according to claim 3, further comprising a step of roughening the epitaxial structure to form a roughened surface after the step of removing the first growth substrate.

5. The method for making a light-emitting device according to claim 1, further comprising a step of forming at least one opening by removing a part of the epitaxial structure and a step of forming multiple micro chips, wherein each opening is between two adjacent micro chips.

6. The method for making a light-emitting device according to claim 5, further comprising a step of forming an insulating layer inside the at least one opening.

7. The method for making a light-emitting device according to claim 5, further comprising a step of forming a conductive structure between two adjacent micro chips to electrically connect the micro chips.

8. The method for making a light-emitting device according to claim 1, wherein the step of providing a protection layer comprises a step of providing a second growth substrate and a step of forming the protection layer on the second growth substrate.

9. The method for making a light-emitting device according to claim 8, further comprising a step of removing the second growth substrate after the step of connecting the heat dispersion substrate with the protection layer by the first connecting layer.

10. The method for making a light-emitting device according to claim 1, further comprising a step of forming a reflection layer on the protection layer before the step of connecting the heat dispersion substrate with the protection layer by the first connecting layer.

11. The method for making a light-emitting device according to claim 10, further comprising a step of forming an adhesive layer on the protection layer before the step of forming the reflection layer on the protection layer.

12. The method for making a light-emitting device according to claim 1, wherein the step of connecting the heat dispersion substrate with the protection layer by a first connecting layer comprises the steps of: forming a third connecting layer on the protection layer; forming a fourth connecting layer on the heat dispersion substrate; and connecting the third connecting layer with the fourth connecting layer to form the first connecting layer.

13. The method for making a light-emitting device according to claim 1, wherein the first connecting layer and the second connecting layer are on the same side of the heat dispersion substrate.

14. The method for making a light-emitting device according to claim 1, wherein the protection layer comprises III-V group material.

15. The method for making a light-emitting device according to claim 1, further comprising a step of roughening a surface of the protection layer to form a roughened surface.

* * * * *